United States Patent [19]

Carome et al.

[11] Patent Number: 4,477,723
[45] Date of Patent: Oct. 16, 1984

[54] FIBER OPTIC ELECTRIC FIELD SENSOR/PHASE MODULATOR

[75] Inventors: Edward F. Carome, South Euclid, Ohio; Charles M. Davis, McLean, Va.

[73] Assignee: Optical Technologies, Inc., McLean, Va.; a part interest

[21] Appl. No.: 318,094

[22] Filed: Nov. 4, 1981

[51] Int. Cl.³ .............................................. G02B 5/14
[52] U.S. Cl. ....................................... 250/227; 324/96
[58] Field of Search ................. 350/96.1, 96.13, 96.15, 350/96.29; 250/227; 324/96, 71; 332/7.51; 73/653, 657; 455/610, 612

[56] References Cited

U.S. PATENT DOCUMENTS 4,068,191  1/1978  Zemon et al. ............... 350/96.13
4,268,116  5/1981  Schmadel et al. ........... 350/96.29
4,319,186  3/1982  Kingsley ..................... 332/7.51
4,376,248  3/1983  Giallorenzi et al. .......... 324/96

Primary Examiner—David C. Nelms
Attorney, Agent, or Firm—Fay & Sharpe

[57] ABSTRACT

The invention relates to a technique for detecting electric fields by modulating the phase of an optical beam. A length of optical fiber is jacketed with or attached to piezoelectric material that is poled perpendicular to the length of the fiber. An electric field is applied across the piezoelectric element, i.e. in the direction of poling, resulting in a change in the element thickness and a change in the axial dimension, which, in turn, changes the length of the optical fiber. The change in fiber length is accompanied by a smaller change in the refractive index of the fiber. The result is a shift in the optical phase.

26 Claims, 10 Drawing Figures

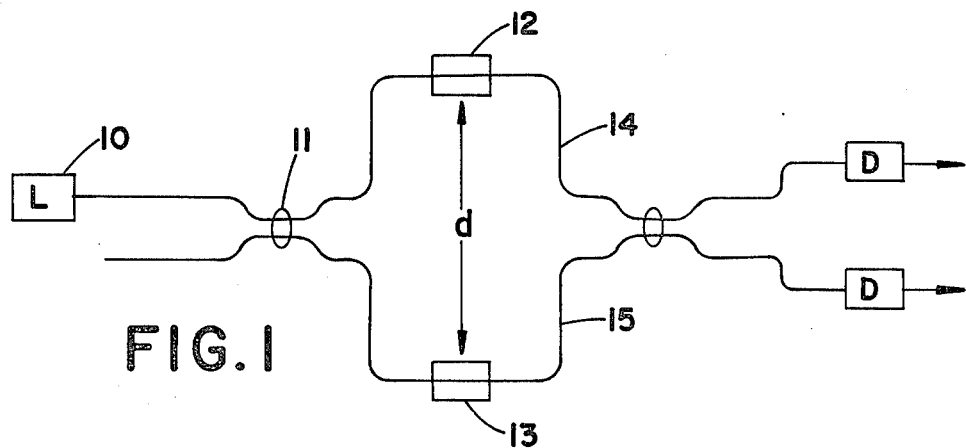
FIG. 1
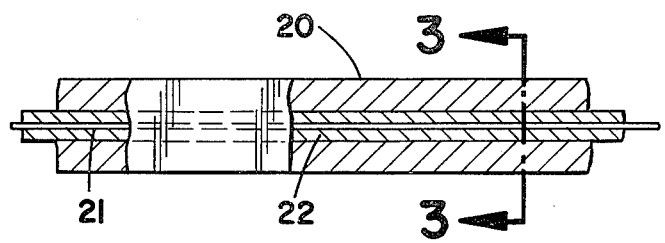
FIG. 2
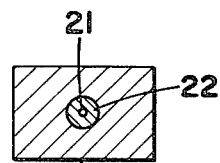
FIG. 3
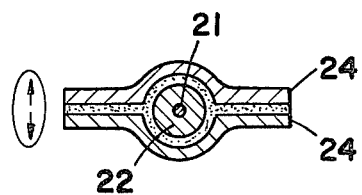
FIG. 4
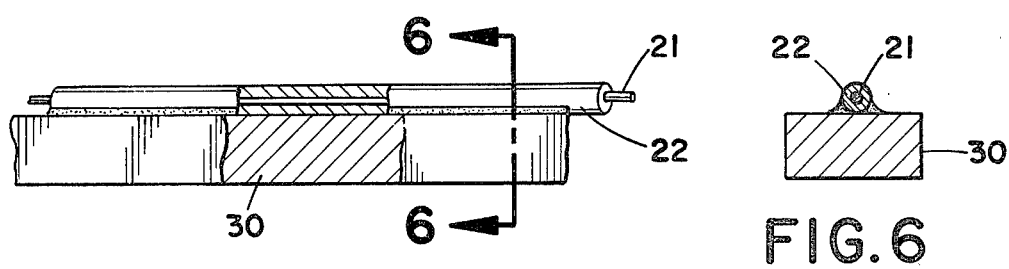
FIG. 5
FIG. 6

FIBER OPTIC ELECTRIC FIELD SENSOR/PHASE MODULATOR

BACKGROUND OF THE INVENTION

The broad concept of impressing a phase (or frequency) modulation onto a fiber optic cable used for telecommunications is known in the art. Modulating means is affixed externally to the fiber and coupled thereto without breaking the fiber. An illustrative application includes a single fiber cable disposed within (or around) a telecommunication highway, and a plurality of modulating means may be attached to impress the status of a number of machines. The status from each device is modulated onto the cable, and a phase/frequency monitor decodes and displays the desired data.

The following U.S. patents are examples of systems employing fiber optic modulation:

| | |
|---|---|
| 4,077,700 | Camphausen |
| 4,086,484 | Steensma |
| 4,068,191 | Zemon et al |
| 4,002,896 | Davies et al |
| 3,781,092 | Sussman |
| 3,756,690 | Borrelli et al |
| 3,625,589 | Snitzer |

U.S. Pat. No. 4,002,896 to Davies et al. discloses a number of modulating means along a fiber optic telecommunications system to impress a phase modulation (see col. 2, lines 18–39) onto the signals carried by the fiber. In FIG. 2 a piezoelectric plate is affixed by an adhesive to the outside of fiber to effect the modulation. FIGS. 6 and 7 (col. 4, line 41) show an optical fiber and a covering of piezoelectric material 86. On the inside and outside are conductive layers 84 and 88. Leads 90 are connected to the conductive layers.

The present invention is a broader concept of impressing the electric field or electromagnetic radiation directly upon the piezoelectric element which covers or is attached to the optical fiber. The piezoelectric element, e.g. $PVF_2$, i.e. polyvinylidene fluoride, lithium niobate, zinc oxide, or lead zirconate-lead titanate, is in contact with the optical fiber and when electromagnetic radiation is impressed on the element, it produces a strain in the element and in the fiber. An optical phase change in the fiber is thus produced due to the changes in the index of refraction as well as length.

The Davies et al. patent teaches use of a telecommunication system which uses optical fibers with a source of coherent light, such as a laser. The sensor consists of a data unit coupled to the highway by means of electrically driven piezoelectric film (FIG. 6, col. 4, line 51). The film is energized to provide a data input to the highway which is then detected. The fiber detects the change in three ways—a change in length, a change in diameter and a change in refractive index. The diameter change is very small (0.2%).

The concept is that light from a laser and electromagnetic radiation can be modulated by a driven piezoelectric data unit and then demodulated. The communication highway is planned for fixed elements of data to be modulating the carrier and then detected. It always has to be electrically coupled, and then detected. The electrically coupled or driven piezoelectric material is physically moved to change length, diameter and/or refractive index.

U.S. Pat. No. 3,681,092 to Sussman et al. also discloses a monitoring system wherein the data being monitored is modulated onto optical fibers. The disclosure, however, is largely in terms of a brute force (chopper) modulator, and only a terse suggestion of analog modulators is noted in column 5, lines 48–62.

U.S. Pat. No. 4,068,191 to Zemon et al. teaches the modulation of light within fiber optic waveguides by externally applied means. In this instance, the fiber is acoustically modulated in response to corresponding RF energy applied to the modulating means.

With respect to fiber optics, modulators per se, which are externally applied without breaking the fiber, are taught in U.S. Pat. No. 3,625,589 to Snitzer, which discloses a piezoelectric modulator; U.S. Pat. No. 3,756,690 to Borrelli et al., which teaches the use of a magnetic field modulator (of a special fiber); U.S. Pat. No. 4,077,700 to Camphausen, which teaches the use of CCD to create an electric field for modulating, and U.S. Pat. No. 4,086,484 to Steensma, which discloses an acoustic transducer for optical fiber modulation.

Measurements of optical fiber modulation are frequently accomplished with interferometers. A discussion follows on the kinds of interferometers used which will aid in clarifying the disclosure of the present invention.

Much of the early work with optical fiber interferometric sensors was done using the Mach-Zehnder interferometer, wherein fiber elements replaced air paths using microscope objectives to focus the light into the fibers on the input ends and monitoring with one (or two) photodetectors the central bright spot of the interference pattern formed by combining the expanding beams from the output ends of the two fibers. U.S. Pat. No. 4,238,856 to Bucaro et al. describes, however, a Fabry-Perot type interferometer sensor.

At the present time, all-fiber interferometers are coming into use. These include the Michelson, Mach-Zehnder and Fabry-Perot interferometer configurations. A fiber pig-tail is attached to a solid state laser and coupled to the input end of a fiber. The beam splitters are replaced with fiber-to-fiber couplers, which are one of several types of existing elements where the cores of two fibers are brought close together, e.g. by etching away or lapping down part of the cladding, so that light is transferred from one core to the other. The couplers split the laser output into two equal portions and recombine the light in the two fiber arms, which go on to directly couple into the photodetectors. A signal processor operates on the electrical output from the two photodetectors, each of which is capable of detecting the optical phase shift of one beam or optical path with respect to the other.

In connection with this invention, we use Mach-Zehnder or other types of fiber interferometers with a sensing element in one or both of the fiber arms. The latter configuration acts as a gradiometer to measure spatial variations of electric fields, i.e. a gradient type sensor for electric fields.

SUMMARY OF THE INVENTION

The present invention is directed to an optical fiber electric field sensor system using optical fiber to provide low loss attenuation of light from a source of coherent light source coupled to the fiber, which is a laser. Photodetectors are used for detecting the light. On the fiber is a sensor which consists of a thin coating or platelet of piezoelectric material, such as polyvinylidene fluoride (PVF$_2$), lithium niobate, lead zirconate-lead titanate, zinc oxide, copolymers such as vinylidene fluoride-trifluoroethylene, vinylidene fluoridetetrafluoroethylene, vinylidene fluoride-vinyl fluoride, or vinylidene fluoride-hexapropylene, or combinations thereof. As a result of the combination described herein, an electric field shifts the phase of the coherent light directly, and this phase shift is detected and processed to indicate the magnitude of the electric field.

BRIEF DESCRIPTION OF THE DRAWINGS

FIG. 1 is a Mach-Zehnder interferometer showing the sensing element of this invention on each arm to measure spatial variations of electric fields;

FIG. 2 shows a longitudinal view of the sensor of this invention;

FIG. 3 is a cross-sectional view of FIG. 2 along the line 3—3;

FIG. 4 is a cross-sectional view of an alternate modification of this invention;

FIG. 5 shows a longitudinal view of an alternate modification of this invention;

FIG. 6 is a cross-sectional view of FIG. 5 along the line 6—6;

DESCRIPTION OF THE PREFERRED EMBODIMENTS

Figure 7:
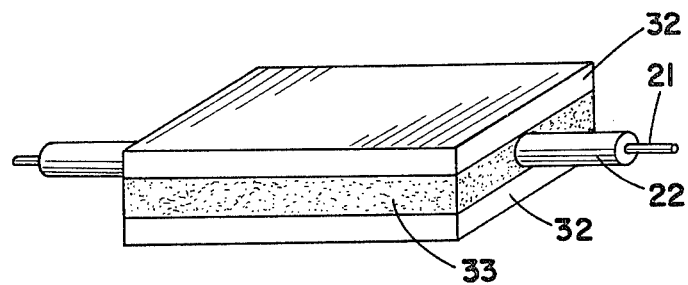
FIG. 7 shows a perspective view of an alternate modification.

The development of acoustooptic techniques for the detection of underwater sound is well known. The most straightforward and sensitive technique involves the measurement of an induced shift in the phase of a light beam propagating along a length of optical fiber. The change in the optical path is due to changes in both the refractive index, n, and the length of fiber, L. The resulting phase shift, $\phi$, is given by the expression:

$$\phi = \frac{\omega}{c} \Delta(nL) = \frac{\pi \eta}{\lambda}\left[S_{11} + \frac{\Delta \eta}{\eta}\right] \quad (1)$$

where $\lambda$ is the wave length of light, $S_{11}$ is the mechanical strain ($=\Delta L/L$) along the axis of the fiber, c is the velocity of light and w is the angular velocity. Techniques for detecting phase shifts as small as $10^{-7}$ radians have been demonstrated. A concept is described for utilizing this approach for the detection of small changes in the electric field and/or utilizing this effect in an optical phase modulator.

The sensor of this invention involves the use of an optical fiber jacketed with or attached to a piezoelectric element, e.g. PVF$_2$, lithium niobate, zinc oxide, etc., such that an applied electric field will produce a strain in the element and, in turn, in the optical fiber. Both the electric displacement, D, and mechanical strain, S, are functions of the electric field, E, and the stress, T. For stress and strain in the axial direction and electric field and electric displacement in the transverse direction, we have:

$$D = \epsilon^T E + d_{31} T$$

-continued $$S = d_{31} E + \frac{1}{C_E} T$$

where the effective piezoelectric strain constant, $d_{31}$, is the change in strain per unit field or the electric displacement per unit change in mechanical tension, $\epsilon^T$ is the permitivity measured with the jacket material under constant tension, and $C_E$ is the stiffness of the material measured under constant electric field.

When the cross-sectional area of the optical fiber is much less than that of the piezoelectric element, the strain in the fiber can be taken equal to that in the piezoelectric material. For a piezoelectric jacketed fiber, the resultant strain is parallel to the axis and corresponds to $S_{11}$ in Eq. (1). To a good approximation, the resulting strain occurs at constant volume and the strain perpendicular to the fiber axis is $S_\perp = 1/2 S_{11}$.

The total phase change in the fiber was shown in Eq. (1) to be due to changes in index of refraction as well as length. The change in refractive index is given by:

$$\Delta n = -\frac{n^3}{2}[(P_{11} + P_{12}) S_\perp + P_{12} S_{11}] \quad (2)$$

making use of the relation between $S_\perp$ and $S_{11}$ and substituting Eq. (2) into Eq. (1) yields:

$$\phi = \frac{2\pi n L}{\lambda}\left(S_{11} - \frac{n^2}{2}[(P_{11} + P_{12}) S_\perp + P_{12} S_{11}]\right) \quad (3)$$

where $P_{11}$ and $P_{12}$ are the Pockels coefficients. For fused quartz $P_{11}=0.12$, $P_{12}=0.27$ and $n=1.46$. Substituting these values into Eq. (3) yields:

$$\phi = \frac{2\pi n L}{\lambda}(.92) S_{11} \quad (4)$$

For the case of a PVF$_2$ element, setting $S_{11}=d_{31}E=2.7\times 10^{-11} E$, $\lambda = 1$ $\mu$m ($10^{-6}$ m) yields:

$$\phi(\text{Radians}) = 2.28 \times 10^{-4} E\left(\frac{\text{volts}}{\text{meter}}\right) L \text{ (meter)}$$

In connection with this application, a Mach-Zehnder interferometer is shown in FIG. 1. This configuration acts as a gradiometer to measure spatial variations of electric field. In other words, it is a gradient type sensor for an electric field which is one use for the invention. Note that in FIG. 1 a laser is connected to a 3 dB coupler. The two paths of the optical fiber are split, and two sensors 12 and are in each path of the interferometer. They may be spaced a distance apart. The optical paths 14 and 15 are then coupled together, and each path is sent to a detector and signal processer to obtain the spatial gradient in the electric field. Each of the sensors are of the type shown in FIGS. 2-10. The covering is sometimes a platelet.

FIG. 2 shows a longitudinal view of a piezoelectric sensing element with the sensor having a platelet 20 surrounding the fiber core 21 and the fiber cladding 22. There may or may not be a polymer protective coating on the fiber.

A portion of the fiber making up one element (arm) of an interferometer is embedded in a piezoelectric platelet (which could be a long element). No electrodes or conducting materials are on the upper or lower surfaces of the platelet. The poling direction is assumed to be perpendicular to the top and bottom surfaces. When exposed to an E field (e.g. perpendicular to the top surface), the thickness of the platelet will increase or decrease, and its length in the direction of the fiber will decrease or increase, respectively, thus changing the length of the fiber. This will produce a relative phase shift of the beam in this arm of the interferometer with respect to the other. The platelet or covering could be $PVF_2$ or a related copolymer material as taught herein. The fiber is embedded in it during the pressing processes. Highly crystalline $PVF_2$ that does not require stretching to produce piezoelectric properties, or the use of particular copolymers that are naturally piezoelectric, are employed so that stretching after embedment is not required. The platelet is poled after embedment, and the metallic electrodes, if employed for poling, are removed from the surface of the platelet. Similarly, the platelet could be lead zirconate-lead titanate or other piezoelectric material.

FIG. 4 is a further modification of the sensor which includes fiber core 21, cladding 22 and platelet strips 24. In this example, fiber cladding (glass), approximately 100 microns in diameter, narrow strips of $PVF_2$ e.g. approximately 25 microns thick and 1-2 millimeters wide, are shaped as shown and cemented to fiber. The fiber core (glass) is approximately 4 microns in diameter. The poling direction of each film is the same and if metallic electrode materials are used during the poling process, they must be removed so that $PVF_2$ is penetrated by E fields to which the fiber sensor element is exposed. Fiber is placed between two narrow strips of $PVF_2$ which are form fit to the outside of the fiber cladding (or even its outer coating) and cemented together and to the fiber. $PVF_2$ is previously poled before mounting.

FIGS. 5 and 6 illustrate a modification of the invention, which, as an example, may be 1 meter long and 1 millimeter wide and 25 microns thick. The piezoelectric strip 30 is attached to fiber having core 21 and cladding 22, with epoxy cement. A uniform E field of 1 volt per meter is directed perpendicular to the thickness of the film. The effective voltage across the 25 micron thickness of the $PVF_2$ strip is then 25 microvolts. The resulting elongation of the 1 meter long strip of $PVF_2$ and the attached fiber results in an optical phase shift of approximately 25 microradians, i.e. a length change of approximately 4 microns. The present state of the art on optical interferometry permits detection and measurements of the order of 1 microradian.

FIG. 7 is a further modification showing piezoelectric plates 32 on either side of the cladding fiber with epoxy cement holding the sandwich together.

Figure 8:
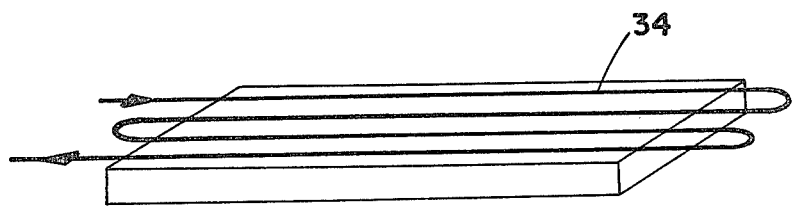
FIG. 8 shows a further modification along the lines of FIGS. 5 and 6.

FIG. 8 illustrates a fiber that is wound back and forth on a piezoelectric platelet and cemented thereto, and each element of fiber is stretched as the platelet elongates when exposed to an electric field.

Figure 9:
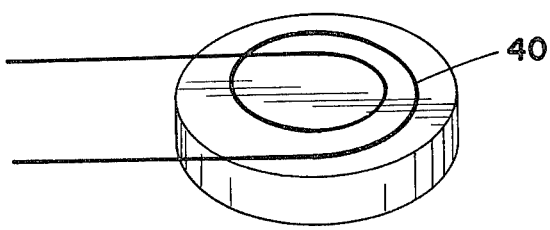
FIG. 9 shows a side view of a further modification.
Figure 10:
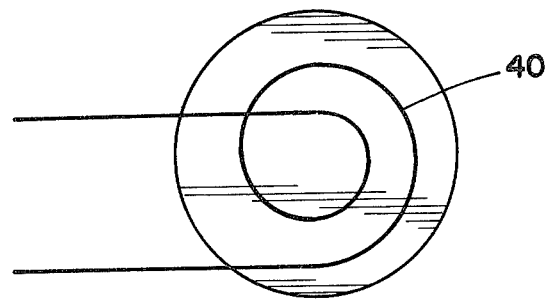
FIG. 10 shows a top view of FIG. 9.

In connection with FIGS. 9 and 10, the fiber is wound in a coil or helix 40 and attached to the top surface of the piezoelectric plate. The plate expands or contracts radially and circumferentially when exposed to an E field perpendicular to its top surface.

The above represent a few of the many possible configurations. In all cases the piezoelectric element is stripped of metal electrodes allowing the external E field to penetrate its volume.

To employ the E field detector as an omnidirectional radio frequency antenna, or as an RF electric field detector, preferably the length of the sensing element should be shorter than $\frac{1}{4}$ of the RF wavelength. For high directivity the length of the fiber preferably should be at least 10 RF wavelengths.

There are many other applications for E field detectors than as an antenna; yet antennas seem to fall within the more general E field devices.

The interferometer sensor system of this invention is able to detect radiation from DC well into the gigahertz range.

The invention has been described with reference to the preferred and alternate embodiments. Obviously, modifications and alterations will be readily apparent to others upon the reading and understanding of the specification. It is the intention to include all modifications and alterations insofar as they come within the scope of the appended claims or the equivalents thereof.

What is claimed is:

1. An antenna system for receiving r.f. electric fields, the system comprising:
   (a) a source of coherent light;
   (b) at least a first and a second optical fiber operatively connected with the coherent light source for transmitting coherent light therefrom;
   (c) photodetector means operatively connected with the optical fibers for detecting the coherent light transmitted therethrough; and,
   (d) an electric field-responsive sensor operatively connected with at least the first optical fiber, the sensor including:
      (i) an electric field receiving piezoelectric element which is unshielded by electrodes such that electric fields are free to impinge directly thereon, the piezoelectric element being poled such that the incident electric fields cause corresponding length changes in the piezoelectric element,
      (ii) means for attaching the piezoelectric element to the first optical fiber such that the length changes of the piezoelectric member cause a corresponding length changes of the first optical fiber, whereby the incident electric fields change the length of the optical path between the coherent source and the photodetector means through the first optical fiber which, in turn, changes the relative phase of the coherent light transmitted through the first and second optical fibers in correspondence to the incident electric field.

2. The antenna system as set forth in claim 1 wherein the first optical fiber includes a light transmissive core which is surrounded by light-reflective cladding, the piezoelectric element being attached to said cladding.

3. The antenna system as set forth in claim 2 wherein the piezoelectric element is a sleeve surrounding the cladding.

4. The antenna system as set forth in claim 2 wherein the piezoelectric element includes a first piezoelectric plate having a minor dimension transverse to said first optical fiber, the first piezoelectric plate being poled along the minor dimension.

5. The antenna system as set forth in claim 4 further including a second piezoelectric plate disposed parallel to the first piezoelectric plate and attached to the first optical fiber.

6. The antenna system as set forth in claim 4 wherein the first optical fiber passes back and forth in a plurality of parallel paths along the first piezoelectric plate.

7. The antenna system as set forth in claim 4 wherein the first optical fiber is attached to the first piezolectric plate in a spiral pattern.

8. The antenna system as set forth in claim 4 wherein the attaching means is an epoxy cement.

9. An optical fiber sensor system for sensing electric fields, the system comprising:
 (a) at least two optical fibers, each optical fiber being adapted to extend between a source of coherent light and a detector means for detecting the relative phase of coherent light transmitted therethrough; and,
 (b) a piezoelectric direct electric field sensor means operatively connected with at least one of the optical fibers for changing the length of said one optical fiber in response to changes in an incident electric field, whereby the change in length of the one optical fiber causes a corresponding change in the relative phase of the coherent light transmitted through the optical fibers.

10. The system as set forth in claim 9 wherein the electric field sensor means includes:
 a piezoelectric element which is unshielded by electrically conductive elements, which conductive elements would tend to shield the piezoelectric element from the incident electric field, the piezoelectric element responding to changes in the incident electric field by changing a physical dimension correspondingly, the piezoelectric element being attached to the one optical fiber such that the one optical fiber changes length in correspondence with changes in the piezoelectric element physical dimension.

11. The system as set forth in claim 10 wherein the piezoelectric element is poled transverse to said physical dimension.

12. The system as set forth in claim 11 wherein the one optical fiber is attached to the piezoelectric element in a spiral pattern.

13. The system as set forth in claim 11 wherein said one optical fiber includes a light transmissive core which is surrounded by light-reflective cladding, the piezoelectric element being attached to said cladding.

14. The system as set forth in claim 13 wherein the piezoelectric element is a sleeve surrounding the cladding.

15. The system as set forth in claim 10 wherein the piezoelectric element is a piezoelectric plate having a minor dimension transverse to said one optical fiber, the piezoelectric plate being poled along the minor dimension.

16. The system as set forth in claim 15 further including a second piezoelectric plate disposed parallel to the first piezoelectric plate and attached to the one optical fiber.

17. The system as set forth in claim 15 wherein said one optical fiber passes back and forth along the piezoelectric plate a plurality of times.

18. The system of claim 10 in which the piezoelectric is polyvinylidene fluoride.

19. The system of claim 10 in which the piezoelectric is lithium niobate.

20. The system of claim 10 in which the piezoelectric is zinc oxide.

21. The system of claim 10 in which the piezoelectric is lead zirconate-lead titanate.

22. The system of claim 10 in which the piezoelectric is a copolymer is vinylidene fluoride and trifluoroethylene.

23. The system of claim 10 in which the piezoelectric is a copolymer of vinylidene fluoride and tetrafluoroethylene.

24. The system of claim 10 in which the piezoelectric is a copolymer of vinylidene fluoride and vinyl fluoride.

25. The system of claim 10 in which the piezoelectric is a copolymer of vinylidene fluoride and hexapropylene.

26. A method of receiving electric fields comprising:
 transmitting coherent light through at least two optical fibers;
 comparing the relative phase of the coherent light transmitted through the two fibers;
 piezoelectrically exerting a longitudinal strain along one of the optical fibers, which optical strain varies in proportion to an incident electric field, the longitudinal strain altering the physical properties of the one optical fiber including the length of the one optic fiber in correspondence to the incident electric field, whereby the incident electric field causes a change in the relative lengths of the two optical fibers which, in turn, changes the relative phase between the coherent light transmitted through the two optic fibers in correspondence to the incident electric fields; and,
 determining a change in the relative phase of the coherent light transmitted through the two optic fibers which corresponds to the incident electric field.

* * * * *